(12) United States Patent
Konda et al.

(10) Patent No.: US 6,232,758 B1
(45) Date of Patent: May 15, 2001

(54) LOAD DRIVE CONTROL APPARATUS

(75) Inventors: Shinichi Konda, Anjo; Kunihiko Goto, Okazaki; Satoru Asai, Ichinomiya, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/365,753

(22) Filed: Aug. 3, 1999

(30) Foreign Application Priority Data

Aug. 3, 1998 (JP) .................................................. 10-219069

(51) Int. Cl.[7] ...................................................... H02J 1/00
(52) U.S. Cl. .............................................................. 323/351
(58) Field of Search ..................................... 323/266, 273, 323/282, 349, 351

(56) References Cited

U.S. PATENT DOCUMENTS

| 4,914,469 | 4/1990 | Ishimura et al. | 354/484 |
|---|---|---|---|
| 5,234,319 | * 8/1993 | Wilder | 417/40 |
| 5,485,342 | * 1/1996 | Sugino et al. | 361/104 |
| 5,646,458 | * 7/1997 | Bowyer et al. | 307/67 |
| 5,967,253 | * 10/1999 | Collier-Hallman | 180/421 |

FOREIGN PATENT DOCUMENTS

| 59-159700 | 9/1984 | (JP) . |
|---|---|---|
| 62-24718 | 2/1987 | (JP) . |
| 62-89427 | 4/1987 | (JP) . |
| 1-288840 | 11/1989 | (JP) . |

* cited by examiner

*Primary Examiner*—Matthew Nguyen
(74) *Attorney, Agent, or Firm*—Pillsbury Winthrop LLP

(57) ABSTRACT

A load drive control apparatus includes a drive control circuit for driving and controlling a load in response to a given drive condition. A power supply circuit operates for feeding drive electric power to the drive control circuit. The feed of the drive electric power to the drive control circuit by the power supply circuit is controlled in response to a control signal for drive and control of the load to implement a change between a normal mode of operation and a standby mode of operation in which consumed electric power is reduced.

13 Claims, 9 Drawing Sheets

LOAD DRIVE CONTROL APPARATUS

BACKGROUND OF THE INVENTION

1. Field of the Invention

This invention generally relates to a load drive control apparatus. This invention particularly relates to an apparatus including a circuit for driving and controlling a load on an electric power source in response to a given condition.

2. Description of the Related Art

Air conditioners for automotive vehicles include blower motors and cooling fan motors which are loads on vehicular batteries. It is desirable to reduce electric power consumption during suspension of such motors.

A known load drive control apparatus associated with an air conditioner includes a relay switch connected between a vehicular battery and a motor. When the air conditioner is turned off, the relay switch is changed to its open position so that the feed of electric power from the battery to the motor is cut off. The power cutoff enables power economy. In the known load drive control apparatus, the relay switch is required to have a great rating current. Accordingly, the relay switch tends to be large in size and expensive.

SUMMARY OF THE INVENTION

It is an object of this invention to provide an inexpensive load drive control apparatus.

A first aspect of this invention provides a load drive control apparatus comprising a drive control circuit for driving and controlling a load in response to a given drive condition; a power supply circuit for feeding drive electric power to the drive control circuit; and mode change means for controlling feed of the drive electric power to the drive control circuit by the power supply circuit in response to a control signal for drive and control of the load to implement a change between a normal mode of operation and a stand-by mode of operation in which consumed electric power is reduced.

A second aspect of this invention provides a load drive control apparatus comprising a drive control circuit for driving and controlling a load in response to a given drive condition; a power supply circuit for feeding drive electric power to the drive control circuit; and mode change means for controlling feed of the drive electric power to the drive control circuit by the power supply circuit in response to a control signal for drive and control of the load to implement a change between a normal mode of operation and a stand-by mode of operation in which the feed of the drive electric power to the drive control circuit by the power supply circuit is suspended.

A third aspect of this invention is based on the first aspect thereof, and provides a load drive control apparatus wherein the mode change means comprises a capacitor, a charging/discharging change circuit for selectively charging and discharging the capacitor in response to the control signal, and means for implementing a change between the normal mode and the stand-by mode in response to a voltage at an end of the capacitor.

A fourth aspect of this invention is based on the third aspect thereof, and provides a load drive control apparatus wherein the control signal includes a pulse signal having a duty cycle which depends on the drive condition, and the mode change means comprises a charging circuit for charging the capacitor by a charging current, and a discharging circuit for discharging the capacitor at a discharging current, and wherein a ratio between the charging current and the discharging current is substantially equal to a duty cycle of the pulse signal which corresponds to a threshold value for a change between the normal mode and the stand-by mode.

A fifth aspect of this invention is based on the fourth aspect thereof, and provides a load drive control apparatus wherein the duty cycle corresponding to the threshold value is smaller than a duty cycle of the pulse signal which corresponds to a condition of starting drive of the load.

A sixth aspect of this invention is based on the first aspect thereof, and provides a load drive control apparatus wherein the control signal includes a pulse signal having a frequency which depends on the drive condition, and the mode change means comprises means for detecting the frequency of the pulse signal, and means for implementing a change between the normal mode and the stand-by mode in response to the detected frequency of the pulse signal.

A seventh aspect of this invention is based on the first aspect thereof, and provides a load drive control apparatus further comprising a main power source, and wherein the power supply circuit derives the drive electric power from main electric power fed from the main power source, and wherein the mode change means comprises means for detecting a voltage of the main power source, and means for changing a timing of a change between the normal mode and the stand-by mode in response to the detected voltage of the main power supply.

An eighth aspect of this invention is based on the first aspect thereof, and provides a load drive control apparatus further comprising means for detecting a drive condition of the load, and means for generating the control signal in response to the detected drive condition, and wherein the mode change means comprises means for detecting whether or not drive of the load is suspended on the basis of the control signal, and means for implementing a change from the normal mode to the stand-by mode when it is detected that the drive of the load is suspended.

A ninth aspect of this invention is based on the eighth aspect thereof, and provides a load drive control apparatus wherein the mode change means comprises means for detecting whether or not the drive of the load is abnormal, and means for implementing a change from the normal mode to the stand-by mode when it is detected that the drive of the load is abnormal.

A tenth aspect of this invention is based on the first aspect thereof, and provides a load drive control apparatus further comprising means for detecting a condition of control by the drive control circuit, and means for generating the control signal in response to the detected control condition, and wherein the mode change means comprises means for detecting whether or not the control by the drive control circuit is abnormal, and means for implementing a change from the normal mode to the stand-by mode when it is detected that the control by the drive control circuit is abnormal.

An eleventh aspect of this invention is based on the first aspect thereof, and provides a load drive control apparatus wherein the power supply circuit comprises switching elements for controlling feed of the drive electric power to the drive control circuit, a voltage boosting circuit for boosting a voltage of the drive electric power, and a voltage-drop compensation circuit for compensating for a voltage drop caused by the switching elements on the basis of the boosted voltage generated by the voltage boosting circuit.

A twelfth aspect of this invention is based on the first aspect thereof, and provides a load drive control apparatus further comprising a voltage boosting circuit for boosting a voltage of the drive electric power fed from the power supply circuit, and a power generation circuit for generating boosted electric power on the basis of the boosted voltage generated by the voltage boosting circuit, and for feeding the boosted electric power to the drive control circuit.

A thirteenth aspect of this invention is based on the twelfth aspect thereof, and provides a load drive control apparatus wherein the power generation circuit comprises means for starting operation of the voltage boosting circuit when the mode change means implements a change from the stand-by mode to the normal mode.

A fourteenth aspect of this invention is based on the first aspect thereof, and provides a load drive control apparatus wherein the drive control circuit comprises switching elements for controlling the load, and means for turning on at least one of the switching elements to brake the load when the normal mode has been replaced by the stand-by mode.

A fifteenth aspect of this invention is based on the first aspect thereof, and provides a load drive control apparatus wherein the control signal includes a serial signal having a pattern composed of high-level states and low-level states, the pattern depending on the drive condition, and wherein the mode change means comprises means for detecting the pattern of the serial signal, and means for implementing a change between the normal mode and the stand-by mode in response to the detected pattern of the serial signal.

DESCRIPTION OF THE PREFERRED EMBODIMENTS

Figure 1:
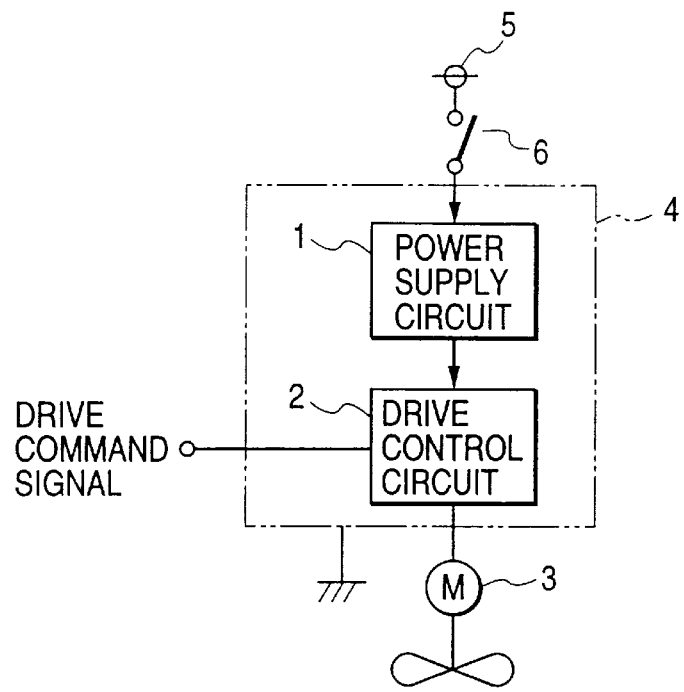
FIG. 1 is a block diagram of a prior-art load drive control apparatus.

A prior-art load drive control apparatus will be explained below for a better understanding of this invention. With reference to FIG. 1, a prior-art load drive control apparatus includes a power supply circuit 1 and a drive control circuit 2. The drive control circuit 2 is connected between the power supply circuit 1 and an air-conditioner motor 3. The power supply circuit 1 and the drive control circuit 2 compose a controller 4 which acts to drive and control the motor 3.

In the prior-art apparatus of FIG. 1, the power supply circuit 1 is connected to a vehicular battery via a relay switch 6. The motor 3 is a load on the battery 5. When the air conditioner is turned off, the relay switch 6 is changed to its open position so that the feed of electric power from the battery to the controller 4 is cut off. At the same time, the feed of electric power to the motor 3 is also cut off.

In the prior-art apparatus of FIG. 1, when the relay switch 6 is in its closed position, a great current flows therethrough. Thus, the relay switch 6 is required to have a great rating current. Accordingly, the relay switch 6 tends to be large in size and expensive.

First Embodiment

Figure 2:
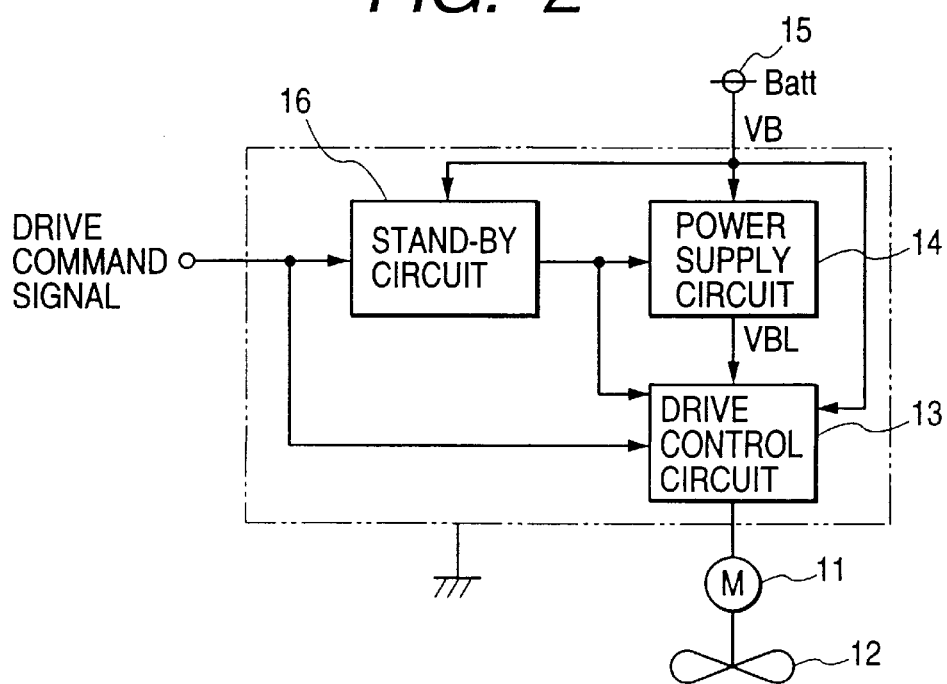
FIG. 2 is a block diagram of a load drive control apparatus according to a first embodiment of this invention.

FIG. 2 shows a load drive control apparatus according to a first embodiment of this invention. With reference to FIG. 2, a motor (a load) 11 of a brushless type has an output shaft connected to an automotive air-conditioner fan 12. The fan 12 is disposed within the front of an automotive vehicle body. The fan 12 is driven and rotated by the motor 11, feeding a flow of conditioned air to a passenger'compartment of the automotive vehicle body.

The load drive control apparatus in FIG. 2 includes a drive control circuit 13 for driving and controlling the motor 11. The drive control circuit 13 is connected to a power supply circuit 14. The drive control circuit 13 and the power supply circuit 14 are directly connected to a vehicular battery (Batt) 15. The drive control circuit 13 and the power supply circuit 14 receive main electric power VB from the battery 15. The drive control circuit 13 receives sub electric power VBL from the power supply circuit 14.

The power supply circuit 14 is connected to a stand-by circuit (a mode change means) 16. The stand-by circuit 16 is directly connected to the battery 15. The stand-by circuit 16 receives main electric power VB from the battery 15. A drive command signal (a control signal) for designating a desired rotational speed of the motor 11 can be fed to the drive control circuit 13 and the stand-by circuit 16 from an external.

The stand-by circuit 16 generates a mode change signal in response to the drive command value (the desired speed value) for the motor 11 which is represented by the drive command signal. The stand-by circuit 16 outputs the mode change signal to the drive control circuit 13 and the power supply circuit 14.

Operation of the load drive control apparatus in FIG. 2 can be changed between a normal mode and a stand-by mode. Specifically, the operation mode change is implemented by the power supply circuit 14 in response to the mode change signal. During the normal mode of operation, the power supply circuit 14 continues to feed the sub electric power VBL to the drive control circuit 13. During the stand-by mode of operation, the power supply circuit 14 suspends the feed of the sub electric power VBL to the drive control circuit 13. During the stand-by mode of operation, the rate of electric power fed from the battery 15 and consumed by the drive control circuit 13 and the power supply circuit 14 is remarkably smaller than that in the normal mode of operation. During the stand-by mode of operation, a current equal to, for example, 1 mA or less is consumed by the drive control circuit 13 and the power supply circuit 14.

Figure 3:
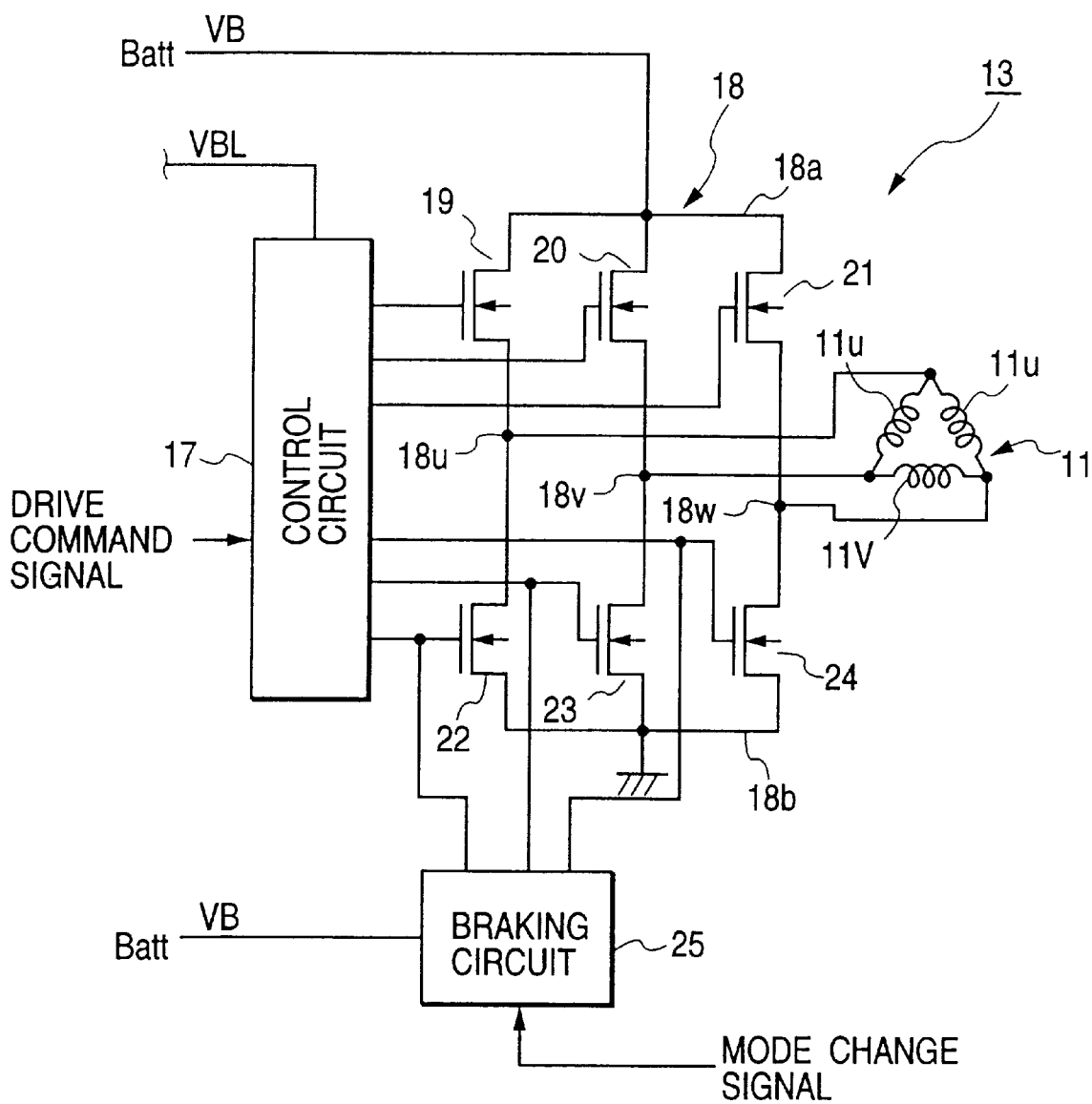
FIG. 3 is a diagram of a drive control circuit in FIG. 2.

As shown in FIG. 3, the drive control circuit 13 includes a microcomputer-based control circuit 17 and a drive circuit 18. The drive circuit 18 has n-channel power MOSFET's (switching elements) 19–24 connected in a three-phase bridge. The MOSFET's will be shortened to the FET's hereinafter. A freewheeling diode (not shown) is connected between the source and the drain of each of the FET's 19–24. The freewheeling diode may be integral with each of the FET's 19–24.

The drive circuit 18 has a positive power feed line 18a and a negative power feed line 18b. The positive power feed line 18a is directly connected to the positive terminal of the battery 15. The negative terminal of the battery 15 is grounded. The negative power feed line 18b is also grounded.

In the drive circuit 18, the drains of the FET's 19, 20, and 21 are connected to the positive power feed line 18a. The sources of the FET's 19, 20, and 21 are connected to the drains of the FET's 22, 23, and 24, respectively. The sources of the FET's 22, 23, and 24 are connected to the negative power feed line 18b. A pair of the FET's 19 and 22 corresponds to a first phase "u". The junction between the source of the FET 19 and the drain of the FET 22 forms a first output terminal 18u of the drive circuit 18. A pair of the FET's 20 and 23 corresponds to a second phase "v". The junction between the source of the FET and the drain of the FET 23 forms a second output terminal 18v of the drive circuit 18. A pair of the FET's 21 and 24 corresponds to a third phase "w". The junction between the source of the FET 21 and the drain of the FET 24 forms a third output terminal 18w of the drive circuit 18. The gates of the FET's 19–24 are connected to output terminals of the control circuit 17, respectively. The gates of the FET's 22, 23, and 24 are connected to output terminals of a braking circuit 25, respectively.

The control circuit 17 has a power supply terminal connected to a power feed terminal or an output terminal of the power supply circuit 14. The control circuit 17 receives the sub electric power VBL from the power supply circuit 14 via the power supply terminal. The control circuit 17 has an internal power supply circuit for deriving an about 5-V electric power from the sub electric power VBL which has a voltage of about 14 V. A main portion of the control circuit 17 is activated by the 5-V electric power.

The motor 11 has three-phase stator windings 11u, 11v, and 11w connected in a "Δ" configuration. The junction between the windings 11u and 11w is connected to the output terminal 18u of the drive circuit 18. The junction between the windings 11w and 11v is connected to the output terminal 18w of the drive circuit 18. The junction between the windings 11v and 11u is connected to the output terminal 18v of the drive circuit 18.

As shown in FIG. 3, the drive control circuit 13 includes the braking circuit 25. The braking circuit directly receives main electric power VB from the battery 15. The braking circuit is activated by the main electric power VB. The braking circuit 25 receives the mode change signal from the stand-by circuit 16. The braking circuit has output terminals connected to the gates of the FET's 22, 23, and 24 respectively. When the mode change signal represents the stand-by mode of operation, the braking circuit replaces the control circuit 17 in controlling the FET's 22, 23, and 24. When the mode change signal represents the normal mode of operation, the output terminals of the braking circuit which are connected to the gates of the FET's 22, 23, and 24 are in states of high impedances.

Figure 4:
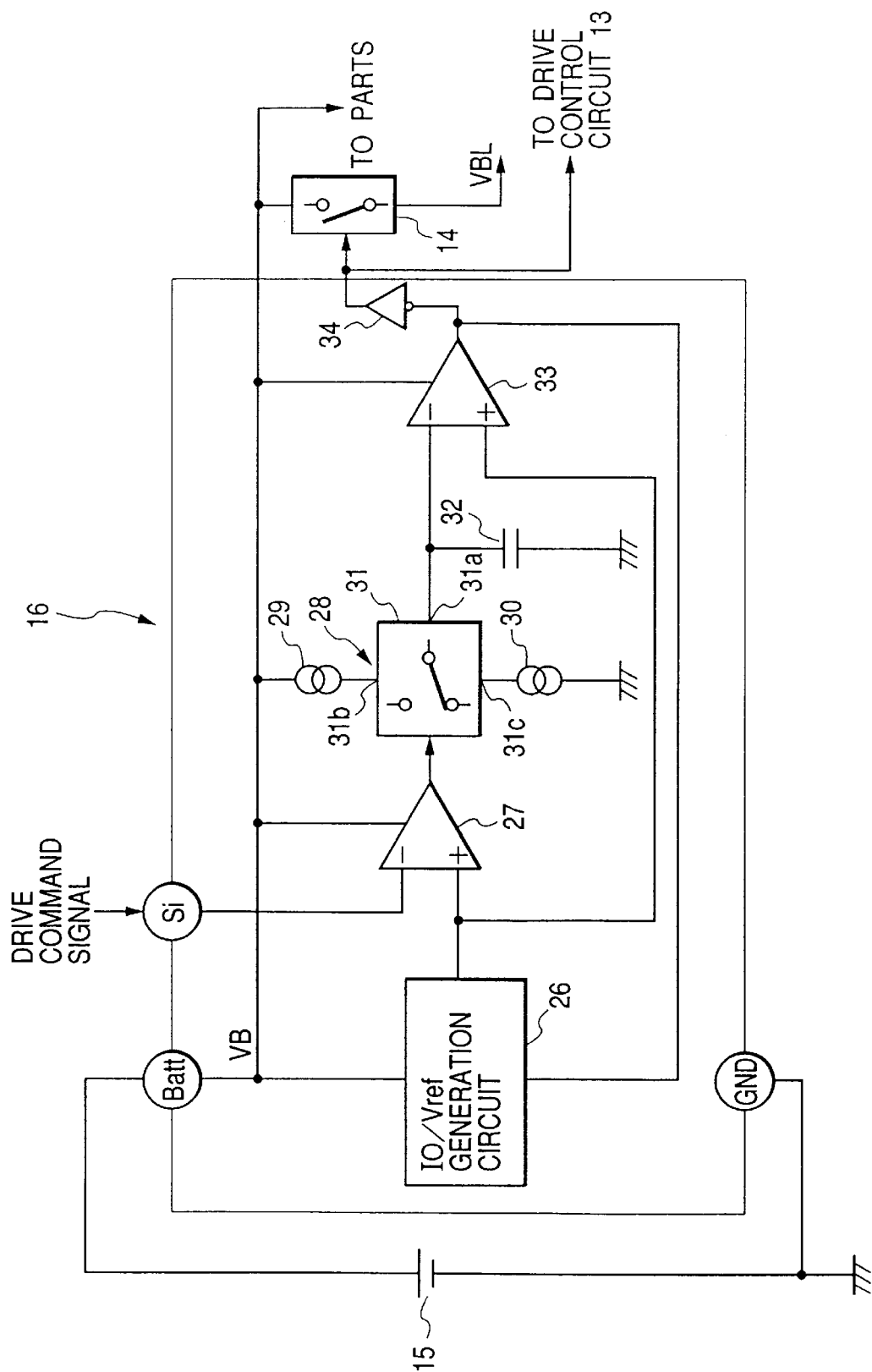
FIG. 4 is a diagram of a stand-by circuit in FIG. 2.

As shown in FIG. 4, the stand-by circuit 16 includes an I0/Vref generation circuit 26 connected to the battery 15. The I0/Vref generation circuit 26 receives main electric power VB from the battery 15. The I0/Vref generation circuit 26 produces a constant current I0 and a reference voltage Vref from the main electric power VB. The reference voltage Vref can be changed between a preset higher level and a preset lower level to provide a hysteresis to switching operation of comparators mentioned later. The I0/Vref generation circuit 26 feeds the constant current I0 to portions of the stand-by circuit 16.

The stand-by circuit 16 also includes a first comparator 27, a charging/discharging change circuit 28, a capacitor 32, a second comparator 33, and an inverter 34. The I0/Vref generation circuit 26 outputs the reference voltage Vref to the non-inverting input terminals of the first and second comparators 27 and 33. The inverting input terminal of the first comparator 27 receives the drive command signal from an external. An output signal of the first comparator 27 is fed to the charging/discharging change circuit 28 as a change control signal.

Figure 5:
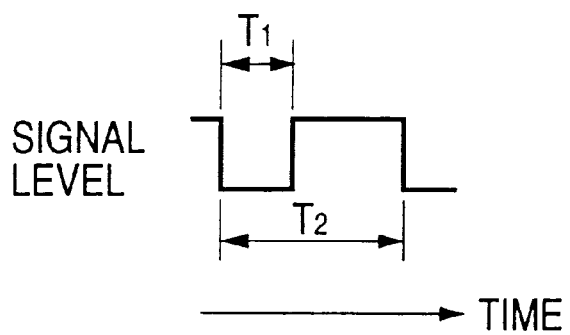
FIG. 5 is a time-domain diagram of a drive command signal.

The drive command signal designates a desired rotational speed of the motor 11. As shown in FIG. 5, the drive command signal is a pulse signal having a variable low-level duty cycle expressed as "(T1/T2)•100 [%]" where "T1" denotes a time interval during which the pulse signal is in its low-level state, and "T2" denotes a period of the pulse signal.

Figure 6:
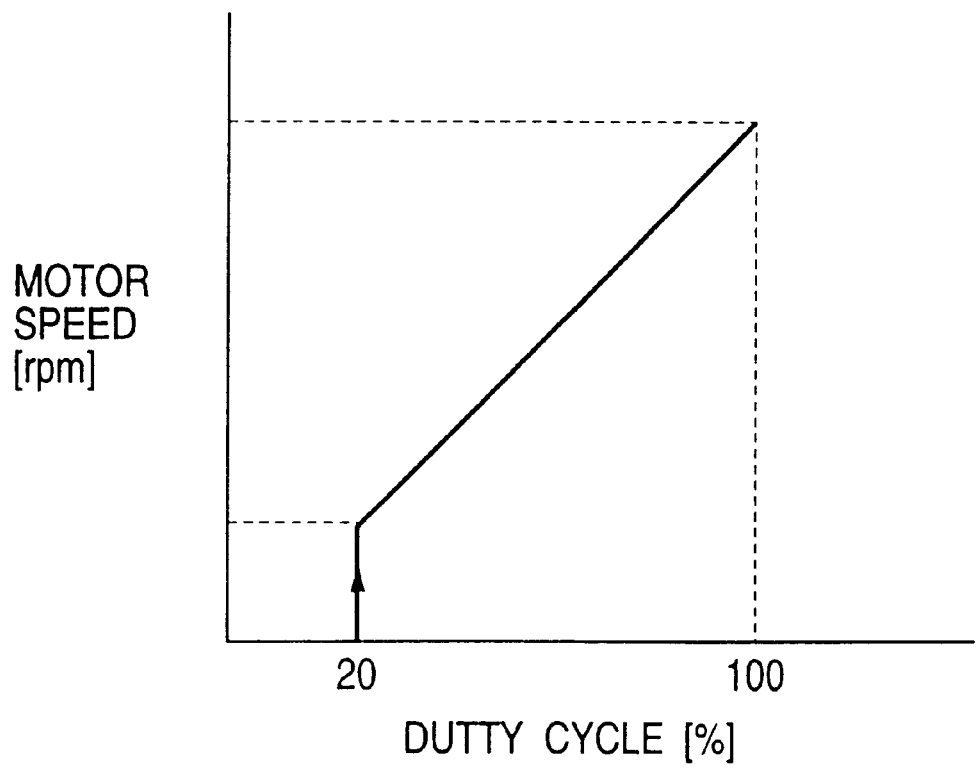
FIG. 6 is a diagram of the relation between a low-level duty cycle of the drive command signal and a desired rotational speed of a motor.

With reference to FIG. 6, the desired rotational speed of the motor 11 which is designated by the drive command signal rises linearly as the low-level duty cycle thereof increases from a predetermined drive start value equal to 20%. The drive control circuit 13 commences drive of the motor 11 and control of the rotational speed of the motor 11 when the low-level duty cycle of the drive command signal increases to 20%.

As shown in FIG. 4, the charging/discharging change circuit 28 includes a charging circuit 29, a discharging circuit 30, and a change control circuit 31. The change control circuit 31 receives the change control signal from the first comparator 27. A first end of the charging circuit 29 is directly connected to the positive terminal of the battery 15. As previously mentioned, the negative terminal of the battery 15 is grounded. A second end of the charging circuit 29 is connected to a first input terminal 31b of the change control circuit 31. A first end of the discharging circuit 30 is connected to a second input terminal 31c of the change control circuit 31. A second end of the discharging circuit 30 is grounded. A first end of the capacitor 32 is connected to an output terminal 31a of the change control circuit 31. A second end of the capacitor 32 is grounded. The change control circuit 31 connects the first end of the capacitor 32 to either the charging circuit 29 or the discharging circuit 30 in response to the change control signal fed from the first comparator 27. The change control circuit 31 includes a switch composed of switching elements formed by, for example, transistors. When the change control circuit 31 connects the first end of the capacitor 32 to the charging circuit 29, the capacitor 32 is charged by a current flowing from the battery 15 via the charging circuit 29 and the change control circuit 31. The charging circuit 29 is designed to provide a predetermined charging current. When the change control circuit 31 connects the first end of the capacitor 32 to the discharging circuit 30, the capacitor 32 is discharged via a current flow path having the discharging circuit 30 and the change control circuit 31. The discharging circuit 30 is designed to provide a predetermined discharging current.

As previously mentioned, the operation change between the stand-by mode and the normal mode responds to the mode change signal. The mode change signal depends on the low-level duty cycle of the drive command signal. The magnitude of the charging current provided by the charging circuit 29 and the magnitude of the discharging current provided by the discharging circuit 30 are predetermined to satisfy the following condition. The ratio of the discharging current to the sum of the charging current and the discharging current is substantially equal to a predetermined threshold value or a predetermined criterion of the low-level duty cycle of the drive command signal for the operation mode change.

The predetermined threshold value or the predetermined criterion of the low-level duty cycle of the drive command signal for the operation mode change is equal to, for example, 5%. In this case, the magnitude of the charging current is set to 19 times that of the discharging current. For example, the charging current is equal to 190 μA while the discharging current is equal to 10 μA. Thus, the ratio of the discharging current to the sum of the charging current and the discharging current is equal to 5%.

The higher level and the lower level of the reference voltage Vref applied to the first comparator 27 are preset between the high level and the low level of the drive command signal. The device 27 compares the drive command signal with the reference voltage Vref, generating a pulse signal which is the change control signal fed to the change control circuit 31. For example, the change control signal is equal to an inversion of the drive command signal. The change control signal has a high-level duty cycle equal to the low-level duty cycle of the drive command signal. As previously mentioned, the change control circuit 31 connects the first end of the capacitor 32 to either the charging circuit 29 or the discharging circuit 30 in response to the change control signal. Specifically, when the change control signal is in its first logic state (its high-level state), the change control circuit 31 connects the first end of the capacitor 32 to the charging circuit 29 so that the capacitor 32 is charged. When the change control signal is in its second logic state (its low-level state), the change control circuit 31 connects the first end of the capacitor 32 to the discharging circuit 30 so that the capacitor 32 is discharged.

The junction between the output terminal 31a of the change control circuit 31 and the first end of the capacitor 32 is connected to the inverting input terminal of the second comparator 33. Thus, the voltage which appears at the first end of the capacitor 32 is applied to the inverting input terminal of the comparator 32. As previously indicated, the non-inverting input terminal of the second comparator 33 receives the reference voltage Vref from the I0/Vref generation circuit 26. The device 33 compares the voltage at the first end of the capacitor 32 with the reference voltage Vref, generating a binary signal. The second comparator 33 outputs the generated binary signal to the inverter 34 and the I0/Vref generation circuit 26. The I0/Vref generation circuit 26 changes the reference voltage Vref between the higher level and the lower level in response to the output signal of the second comparator 33 to provide a hysteresis to switching operation of the first and second comparators 27 and 33. The device 34 inverts or converts the output signal of the second comparator 33 into the mode change signal. The inverter 34 outputs the mode change signal to a control terminal of the power supply circuit 14.

As previously mentioned, the power supply circuit 14 changes operation of the load drive control apparatus in FIG. 2 between the normal mode and the stand-by mode in response to the mode change signal.

Figure 7:
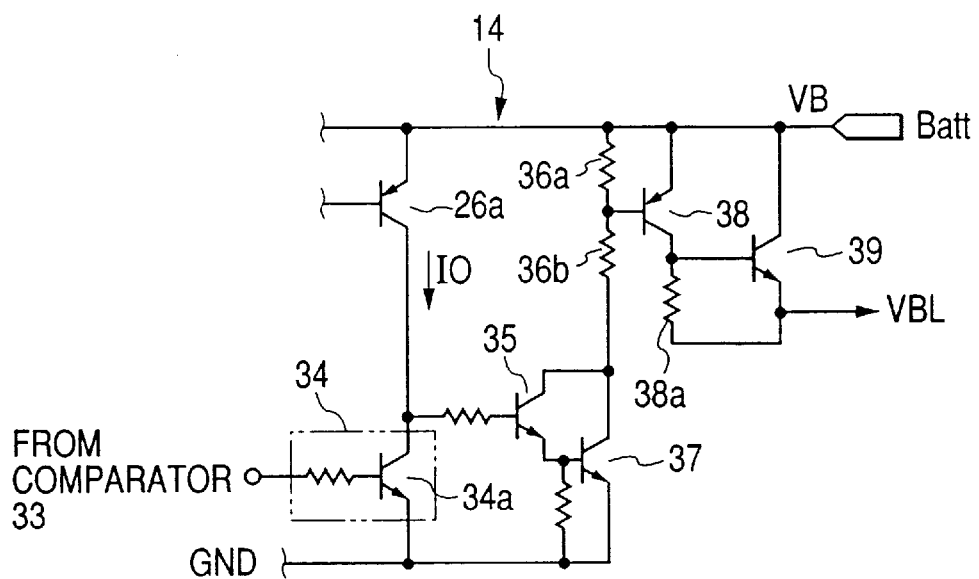
FIG. 7 is a schematic diagram of a power supply circuit in FIG. 2.

With reference to FIG. 7, the inverter 34 includes an npn transistor 34a. The base of the transistor 34a receives the output signal of the second comparator 33 via a resistor (no reference character). The collector of the transistor 34a is connected to the collector of a pnp transistor 26a. The emitter of the transistor 34a is grounded. The transistor 26a forms a portion of the I0/Vref generation circuit 26. The transistor 26a acts to feed a constant current I0. The emitter of the transistor 26a is directly connected to the positive terminal of the battery 15.

As shown in FIG. 7, the power supply circuit 14 includes npn transistors 35, 37, and 39, and a pnp transistor 38. The base of the transistor 3is connected via a resistor (no reference character) to the junction between the collector of the transistor 26a and the collector of the transistor 34a. The collector of the transistor 35 and the collector of the transistor 37 are connected to each other, and are connected to the positive terminal of the battery 15 via a series combination of resistors 36a and 36b. The emitter of the transistor 35 is grounded via a resistor (no reference character). The emitter of the transistor 35 is connected to the base of the transistor 37. The emitter of the transistor 37 is grounded.

The junction between the resistors 36a and 36b is connected to the base of the transistor 38. The emitter of the transistor 38 is connected to the positive terminal of the battery 15. The collector of the transistor 38 is connected to the base of the transistor 39. The collector of the transistor 38 is connected to the emitter of the transistor 39 via a resistor 38a. The collector of the transistor 39 is connected to the positive terminal of the battery 15. The junction between the resistor 38a and the emitter of the transistor 39 is connected to the drive control circuit 13. The sub electric power VBL is fed to the drive control circuit 13 via the junction between the resistor 38a and the emitter of the transistor 39.

Figure 8:
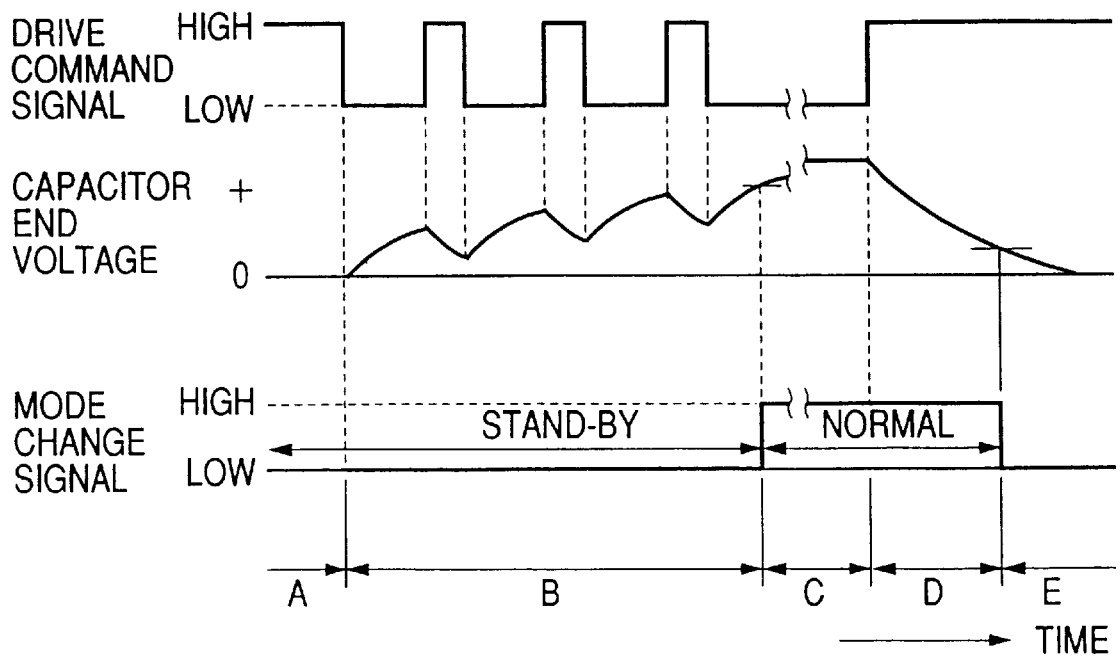
FIG. 8 is a time-domain diagram of the drive command signal, a voltage at an end of a capacitor, and a mode change signal which occur in the apparatus of FIG. 2.

With reference to FIG. 8, a time interval "A" corresponds to an initial condition in which the drive command signal continues to be in its low-level state, and hence the low-level duty cycle of the drive command signal is equal to 0%. During the time interval "A", the motor 11 remains deactivated, and the mode change signal continues to be in its low-level state. During the time interval "A", the power supply circuit 14 continuously suspends the feed of the sub electric power VBL to the drive control circuit 13 in response to the mode change signal so that operation of the load drive control apparatus in FIG. 2 remains in the stand-by mode. During the stand-by mode of operation, the I0/Vref generation circuit 26 holds the reference voltage Vref at the higher level.

When the automotive air-conditioner is started to operate and the low-level duty cycle of the drive command signal is changed to a value in a normal operation range, the time interval "A" is replaced by a time interval "B" (see FIG. 8). It is assumed that the above indicated value in the normal operation range is equal to about 60%. During the time interval "B", the low-level duty cycle of the drive command signal remains equal to about 60%.

The first comparator 27 compares the drive command signal with the reference voltage Vref, thereby outputting the change control signal to the change control circuit 31. The change control circuit 31, the charging circuit 29, and the discharging circuit 30 cause the capacitor 32 to be charged or discharged in response to the change control signal 31. When the drive command signal is in its low-level state, the capacitor 32 is charged by a current of 190 µA so that the voltage at the first end of the capacitor 32 rises at a rate corresponding to the charging current. When the drive command signal is in its high-level state, the capacitor 32 is discharged at a current of 10 µA so that the voltage at the first end of the capacitor 32 drops at a rate corresponding to the discharging current.

In the case where the low-level duty cycle of the drive command signal is equal to 5%, the charging current multiplied by the charging time is equal to the discharging current multiplied by the discharging time during every period of the drive command signal. Thus, in this case, the voltage at the first end of the capacitor 32 remains substantially the same.

In the case where the low-level duty cycle of the drive command signal is greater than 5%, the charging current multiplied by the charging time is greater than the discharging current multiplied by the discharging time during every period of the drive command signal. Thus, in this case, the voltage at the first end of the capacitor 32 rises.

The second comparator 33 compares the voltage at the first end of the capacitor 32 with the reference voltage Vref. When the voltage at the first end of the capacitor 32 reaches the reference voltage Vref, the output signal of the comparator 33 changes to its low-level state so that the mode change signal outputted from the inverter 34 assumes its high-level state. At the same time, the time interval "B" is replaced by a time interval "C" (see FIG. 8). The I0/Vref generation circuit 26 changes the reference voltage Vref to the lower level in response to the change of the output signal of the comparator 33 to its low-level state. When the mode change signal assumes the high-level state, the constant current I0 fed via the transistor 26a flows through the base-emitter path of the transistor 35 so that the transistor 35 changes to its on state.

The transistor 37 assumes its on state upon the change of the transistor 35 to its on state. When the transistor 37 assumes its on state, a base current flows through the transistor 38 so that the transistor 38 changes to its on state. The transistor 39 assumes its on state upon the change of the transistor 38 to its on state. Thus, the sub electric power VBL starts to be fed from the battery 1 to the drive control circuit 13 via the transistors 38 and 39 in the power supply circuit 14. Accordingly, at the moment between the time intervals "B" and "C", the sub electric power VBL starts to be fed to the drive control circuit 13 so that operation of the load drive control apparatus in FIG. 2 changes from the stand-by mode to the normal mode. The change from the stand-by mode to the normal mode occurs earlier as the low-level duty cycle of the drive command signal increases.

When the automotive air-conditioner is turned off and the low-level duty cycle of the drive command signal is changed to smaller than 5%, the time interval "C" is replaced by a time interval "D" (see FIG. 8). Since the low-level duty cycle of the drive command signal is changed to smaller than 5%, the voltage at the first end of the capacitor 32 starts to drop.

When the voltage at the first end of the capacitor 32 reaches the reference voltage Vref, the output signal of the comparator 33 changes to its high-level state so that the mode change signal outputted from the inverter 34 assumes its low-level state. At the same time, the time interval "D" is replaced by a time interval "E" (see FIG. 8). The I0/Vref generation circuit 26 changes the reference voltage Vref to the higher level in response to the change of the output signal of the comparator 33 to its high-level state.

When the mode change signal assumes the low-level state, the constant current I0 fed via the transistor 26a flows through the collector-emitter path of the transistor 34a and hence any base current does not flow through the transistor 35 so that the transistor 35 changes to its off state.

The transistor 37 assumes its off state upon the change of the transistor 35 to its off state. When the transistor 37 assumes its off state, any base current does not flow through the transistor 38 so that the transistor 38 changes to its off state. The transistor 39 assumes its off state upon the change of the transistor 38 to its off state. Thus, the feed of the sub electric power VBL from the battery 15 to the drive control circuit 13 is cut off. Accordingly, at the moment between the time intervals "D" and "E", the feed of the sub electric power VBL to the drive control circuit 13 is cut off so that operation of the load drive control apparatus in FIG. 2 changes from the normal mode to the stand-by mode.

With reference back to FIG. 3, during the normal mode of operation, the control circuit 17 in the drive control circuit 13 remains fed with the sub electric power VBL from the power supply circuit 14. Thus, the control circuit 17 continues to be activated by the sub electric power VBL. The control circuit 17 receives the command drive signal. The control circuit 17 is connected to a position sensor (not shown) for detecting an angular position of a rotor in the motor 11. The control circuit 17 includes a known signal generator for producing control pulse signals in response to the command drive signal and the detected angular position of the rotor in the motor 11. The control circuit 17 feeds the produced control pulse signals to the gates of the FET's 19–24 respectively. There are 120° phase differences among the control pulse signals assigned to the first phase "u", the control signals assigned to the second phase "v", and the control pulse signals assigned to the third phase "w". The FET's 19–24 switch in response to the control pulse signals, thereby driving the motor 11.

The control circuit 17 includes gate drive circuits for the FET's 19–24 respectively. The gate drive circuits are similar to each other. Only one of the gate drive circuits will be explained below.

Figure 9:
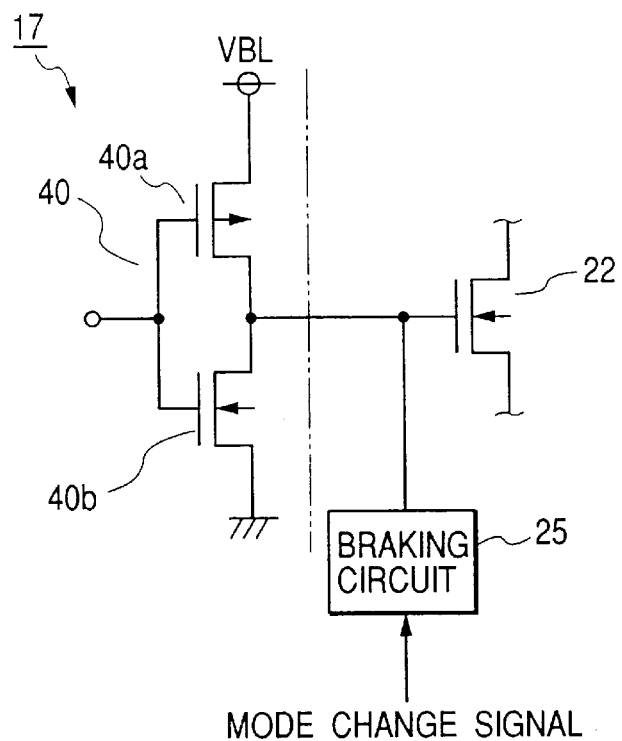
FIG. 9 is a diagram of a portion of a control circuit, an FET, and a braking circuit in FIG. 3.

FIG. 9 shows a portion of the control circuit 17 which forms a gate drive circuit 40 for the FET 22. The gate drive circuit 40 has a CMOS device composed of a p-channel MOSFET 40a and an n-channel MOSFET 40b. The source of the FET 40a is connected to a positive power feed line fed with the sub electric power VBL from the power supply circuit 14. Thus, the source of the FET 40a is connected to the power supply circuit 14. The source of the FET 40b is grounded. The drains of the FET's 40a and 40b are connected to each other, and are connected to the gate of the FET 22. The gates of the FET s 40a and 40b are connected to each other, and follow a preceding stage in the control circuit 17.

During the normal mode of operation, when a low-level control signal is fed to the gates of the FET's 40a and 40b, the FET 40a is turned on and the FET 40b is turned off. In this case, a high-level signal is applied to the gate of the FET 22 so that the FET 22 changes to its on state. When a high-level control signal is fed to the gates of the FET's 40a and 40b, the FET 40a is turned off and the FET 40b is turned on. In this case, a low-level signal is applied to the gate of the FET 22 so that the FET 22 falls into its off state. Since the impedance between the drain and the source of each of the FET's 40a and 40b is high, only a very small current is consumed by the FET's 40a and 40b.

During the stand-by mode of operation, the feed of the sub electric power VBL to the control circuit 17 remains cut off. Thus, the control circuit 17 continues to be deactivated. During the stand-by mode of operation, the braking circuit replaces the control circuit 17 and controls the FET's 22, 23, and 24. Specifically, when the mode change signal corresponds to the stand-by mode of operation, the braking circuit outputs high-level signals to the gates of the FET's 22, 23, and 24 and thereby turns on the FET's 22, 23, and 24. In this case, the stator windings 11$u$, 11$v$, and 11$w$ of the motor 11 are grounded via the FET's 22, 23, and 24. The grounding of the stator windings 11$u$, 11$v$, and 11$w$ can apply a braking force to the motor 11. Preferably, the braking circuit continuously outputs the high-level signals to the gates of the FET's 22, 23, and 24. Alternatively, the braking circuit may intermittently output the high-level signals to the gates of the FET's 22, 23, and 24 at a predetermined period.

During the stand-by mode of operation, the motor 11 continues to be deactivated. During the stand-by mode of operation, when the fan 12 is exposed to a wind so that the motor 11 receives a rotational force, the grounding of the stator windings 11$u$, 11$v$, and 11$w$ applies a braking force to the motor 11 which cancels the rotational force.

As understood from the previous explanation, the operation change between the normal mode and the stand-by mode responds to the low-level duty cycle of the drive command signal. The low-level duty cycle of the drive command signal designates the desired rotational speed of the motor 11 which is a drive condition of the motor 11. Thus, the operation change between the normal mode and the stand-by mode responds to the desired rotational speed of the motor 11, that is, the drive condition thereof. It is possible to dispense with a relay switch which is connected between a vehicular battery and a motor in a prior-art apparatus. This is advantageous in reducing the apparatus cost.

In the stand-by circuit 16, the capacitor 32 removes high-frequency noise from the signal applied to the second comparator 33. Accordingly, it is possible to prevent such high-frequency noise from adversely affecting the control of the operation mode change.

The magnitude of the charging current provided by the charging circuit 29 and the magnitude of the discharging current provided by the discharging circuit 30 are predetermined to satisfy the following condition. The ratio of the discharging current to the sum of the charging current and the discharging current is substantially equal to the predetermined threshold value or the predetermined criterion of the low-level duty cycle of the drive command signal for the operation mode change. As previously indicated, the low-level duty cycle of the drive command signal designates the desired rotational speed of the motor 11, that is, the drive condition thereof. The operation change between the normal mode and the stand-by mode can be implemented in response to the result of a judgment on the low-level duty cycle of the drive command signal with respect to the predetermined threshold value or the predetermined criterion.

The low-level duty cycle of the drive command signal which corresponds to the operation-mode change threshold value is smaller than the low-level duty cycle corresponding to the condition of starting the drive of the motor 11. For example, the low-level duty cycle corresponding to the operation-mode change threshold value is equal to 5% while the low-level duty cycle corresponding to the condition of starting the drive of the motor 11 is equal to 20%. Thus, the stand-by mode of operation can be replaced by the normal mode of operation and hence the sub electric power VBL can start to be fed to the drive control circuit 13 before the condition of starting the drive of the motor 11 is satisfied. Accordingly, the motor 11 can be immediately started upon the satisfactory of the drive starting condition.

Second Embodiment

A second embodiment of this invention is similar to the first embodiment thereof except for design changes mentioned hereinafter. In the second embodiment of this invention, a drive control circuit 13 contains a circuit (or a constant-current circuit) for feeding sub electric power VBL to a control circuit 17. The power feed circuit in the drive control circuit 13 is activated and deactivated by a stand-by circuit 16 or a power supply circuit 14.

Third Embodiment

Figure 10:
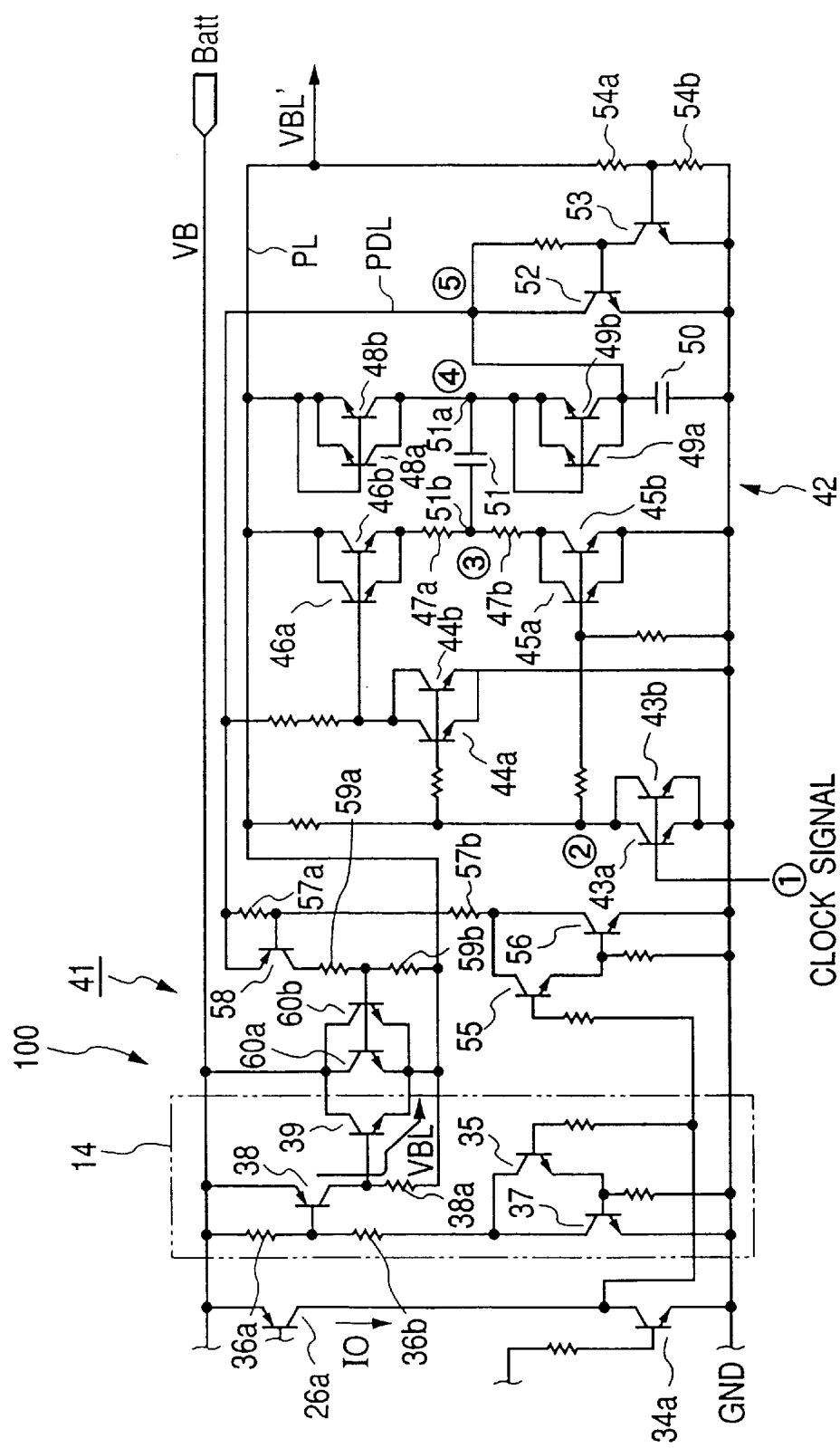
FIG. 10 is a schematic diagram of a power supply circuit and a voltage-drop compensation circuit in a third embodiment of this invention.

A third embodiment of this invention is similar to one of the first and second embodiments thereof except for design changes mentioned hereinafter. FIG. 10 shows a portion of the third embodiment of this invention in which a voltage-drop compensation circuit 41 is added to a power supply circuit 14.

The voltage-drop compensation circuit 41 includes a power feed line PL extending from a junction between the emitter of a transistor 39 and an end of a resistor 38$a$ in the power supply circuit 14. The power feed line PL leads to a drive control circuit 13 (see FIG. 2). A main portion of the voltage-drop compensation circuit 41 is formed by a voltage boosting circuit 42.

In the voltage boosting circuit 42, npn transistors 43$a$ and 43$b$ are connected in parallel to each other. The collectors of the transistors 43$a$ and 43$b$ are connected to the power feed line PL via a resistor (no reference character). The emitters of the transistors 43$a$ and 43$b$ are grounded. A clock signal is fed to the bases of the transistors 43$a$ and 43$b$. The clock signal is designed to control the voltage boosting action. The clock signal is produced by a clock signal generation circuit (not shown) fed with electric power via the power feed line PL.

In the voltage boosting circuit 42, npn transistors 44$a$ and 44$b$ are connected in parallel to each other, and npn transistors 45$a$ and 45$b$ are connected in parallel to each other. The collectors of the transistors 43$a$ and 43$b$ are connected via a resistor (no reference character) to the bases of the transistors 44$a$ and 44$b$. In addition, the collectors of the transistors 43$a$ and 43$b$ are connected via a resistor (no reference character) to the bases of the transistors 45$a$ and 45$b$. The collectors of the transistors 44$a$ and 44$b$ are connected to an output line PDL via a series combination of resistors (no reference characters). Also, the collectors of the transistors 44$a$ and 44$b$ are connected to the bases of npn transistors 46$a$ and 46$b$ which are connected in parallel to each other. The emitters of the transistors 44$a$ and 44$b$ are grounded.

The collectors of the transistors 45$a$ and 45$b$ are connected to the emitters of the transistors 46$a$ and 46$b$ via a series combination of resistors 47$a$ and 47$b$. The bases of the transistors 45$a$ and 45$b$ are grounded via a resistor (no reference character). The emitters of the transistors 45$a$ and 45$b$ are grounded.

In the voltage boosting circuit 42, npn transistors 48$a$ and 48$b$ are connected in parallel to each other, and npn transistors 49$a$ and 49$b$ are connected in parallel to each other.

The bases of the transistors 48a and 48b are connected to the emitters thereof. The emitters of the transistors 48a and 48b are connected to the power feed line PL. The bases of the transistors 49a and 49b are connected to the emitters thereof. The collectors of the transistors 49a and 49b are grounded via a capacitor 50. The collectors of the transistors 48a and 48b are connected to the emitters of the transistors 49a and 49b. In addition, the collectors of the transistors 48a and 48b are connected via a capacitor 51 to the junction between the resistors 47a and 47b.

The junction among the capacitor 50 and the collectors of the transistors 49a and 49b is connected to the output line PDL and the collector of an npn transistor 52. The collector of the transistor 52 is connected via a resistor (no reference character) to the base thereof and the collector of an npn transistor 53. A series combination of resistors 54a and 54b is connected between the power feed line PL and the ground. The junction between the resistors 54a and 54b is connected to the base of the transistor 53. The emitters of the transistors 52 and 53 are grounded.

The voltage-drop compensation circuit 41 includes a combination of npn transistors 55 and 56 which is symmetrical with a combination of npn transistors 35 and 37 in the power supply circuit 14. The base of the transistor 55 is connected via a resistor (no reference character) to the collector of a transistor 34a. The collectors of the transistors 55 and 56 are connected to the output line PDL via a series combination of resistors 57a and 57b. The emitter of a pnp transistor 58 is connected to the output line PDL. The base of the transistor 58 is connected to the junction between the resistors 57a and 57b. The collector of the transistor 58 is connected to the power feed line PL via a series combination of resistors 59a and 59b.

In the voltage-drop compensation circuit 41, npn transistors 60a and 60b are connected in parallel to each other. The junction between the resistors 59a and 59b is connected to the bases of the transistors 60a and 60b. The collectors of the transistors 60a and 60b are directly connected to the positive terminal of a vehicular battery (Batt). The emitters of the transistors 60a and 60b are connected to the power feed line PL.

Figure 11:
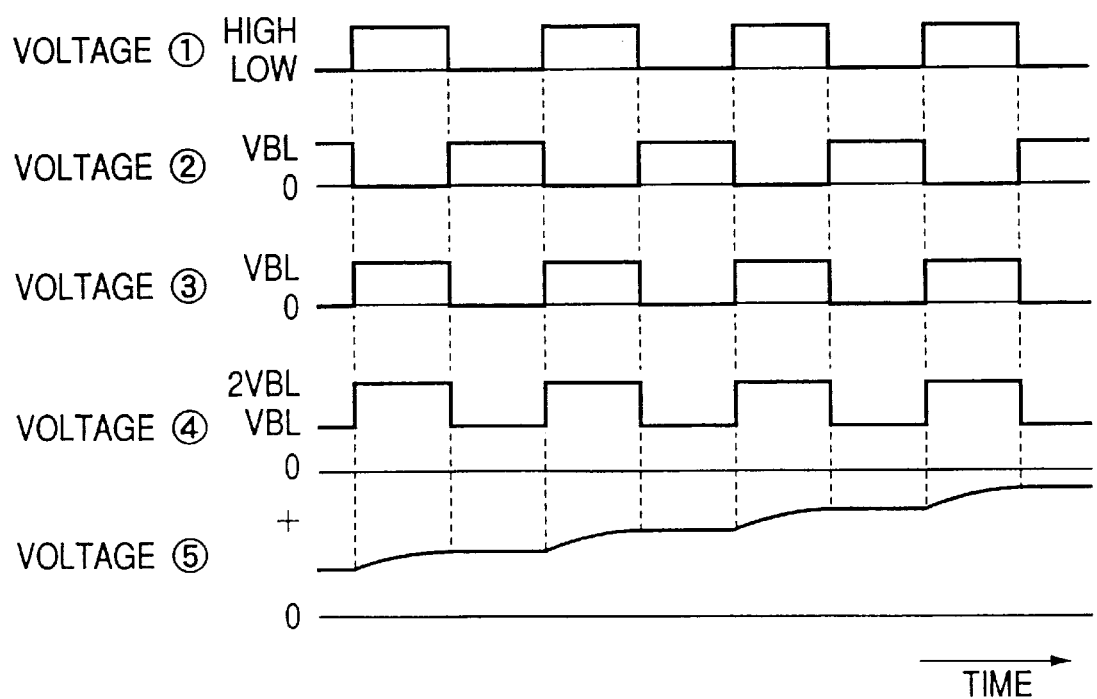
FIG. 11 is a time-domain diagram of voltages occurring at various points in the voltage-drop compensation circuit of FIG. 10.

With reference to FIGS. 10 and 11, the bases ① of the transistors 43a and 43b are subjected to the clock signal which has a frequency of, for example, about 35 kHz (see the portion (a) of FIG. 11). The transistors 43a and 43b are turned on and off synchronously with the clock signal. The voltage ② at the collectors of the transistors 43a and 43b is substantially equal to the ground level when the clock signal is in its high-level state (see the portion (b) of FIG. 11). The voltage ② is substantially equal to a VBL level when the clock signal is in its low-level state (see the portion (b) of FIG. 11). Here, the VBL level means the voltage of the sub electric power VBL.

When the collector voltage ② of the transistors 43a and 43b is substantially equal to the VBL level, the transistors 45a and 45b are in their on states and also the transistors 44a and 44b are in their on states. In this case, since the transistors 44a and 44b are in their on states, the transistors 46a and 46b are in their off states. Accordingly, at this time, the voltage ③ at an end 51b of the capacitor 51 which is connected to the junction between the resistors 47a and 47b is substantially equal to the ground level. In this case, the capacitor 51 is charged so that the voltage VC across the capacitor 51 rises to the level expressed as follows.

$$VC = VBL - VF(Tr48) - VCE(Tr45) \quad (1)$$

where VF(Tr48) denotes a voltage drop caused by the transistors 48a and 48b, and VCE(Tr45) denotes a voltage drop caused by the transistors 45a and 45b.

When the collector voltage ② of the transistors 43a and 43b is substantially equal to the ground level, the transistors 45a and 45b are in their off states and also the transistors 44a and 44b are in their off states. In this case, since the transistors 44a and 44b are in their off states, the transistors 46a and 46b are in their on states. Accordingly, at this time, the voltage ③ at the end 51b of the capacitor 51 is substantially equal to the VBL level (see the portion (c) of FIG. 11), and is expressed as follows.

$$VOLTAGE\ ③ = VBL - VCE(Tr46) \quad (2)$$

where VCE(Tr46) denotes a voltage drop caused by the transistors 46a and 46b.

When the voltage ③ is substantially equal to the ground level, the voltage ④ at an end 51a of the capacitor 51 which is connected to the junction between the set of the transistors 48a and 48b and the set of the transistors 49a and 49b is substantially equal to the VBL level (see the portion (d) of FIG. 11), and is expressed as follows.

$$VOLTAGE\ ④ = VBL - VF(Tr48) - VCE(Tr45) \quad (3)$$

On the other hand, when the voltage ③ is substantially equal to the VBL level, the voltage ④ is substantially equal to twice the VBL level, and is expressed as follows.

$$VOLTAGE\ ④ = VBL - VCE(Tr46) + VBL - VF(Tr48) - VCE(Tr45) \quad (4)$$

The capacitor 50 is charged in response to the voltage ④ so that the voltage ⑤ at the output line PDL increases with the lapse of time. The maximum value of the voltage ⑤ at the output line PDL is equal to the voltage ④ of the equation (4) minus a voltage drop VF(Tr49) caused by the transistors 49a and 49b. Thus, in this case, the maximum value of the voltage ⑤ is expressed as follows.

$$VOLTAGE\ ⑤ = 2(VBL - VF - VCE) \quad (5)$$

Provided that electric power inputted into the voltage boosting circuit 42 is greater in rate than electric power outputted therefrom, the voltage ⑤ at the output line PDL gradually rises as shown in the portion (e) of FIG. 11 and finally reaches the value "2(VBL−VF−VCE)".

In the case where a mode change signal assumes a state corresponding to a normal mode of operation, the transistor 35 changes to its on state so that the transistors 38 and 39 also change to their on states. At the same time, the transistor 55 changes to its on state so that the transistors 58, 60a, and 60b also change to their on states. In this case, since the transistor 58 is operated by the voltage "2(VBL−VF−VCE)" which is higher than the VBL level, operation of the transistor 58 can be in a saturation range. The voltage VBL' fed to the drive control circuit 13 (see FIG. 2), that is, the voltage at the power feed line PL, is given as follows.

$$VBL' = VB - VCE(Tr60) \quad (6)$$

where VB denotes the voltage of the vehicular battery (Batt) or the voltage of main electric power VB, and VCE(Tr60) denotes a voltage drop caused by the transistors 60a and 60b. The equation (6) indicates that a voltage drop caused in the power supply circuit 14 can be compensated for.

The boosted voltage ⑤ at the output line PDL may be used by a control circuit 17 (see FIG. 3) in generating control signals applied to the gates of FET's 19, 20, and 21 (see FIG. 3) which form high side switches (upper arms) of a drive circuit 18 (see FIG. 3).

The voltage-drop compensation circuit 41 and the voltage boosting circuit 42 start to operate when operation of the power supply circuit 14 commences. Thus, a voltage boosting process is enabled provided that the power supply circuit 14 operates and hence sub electric power VBL is fed to the power feed line PL. Accordingly, the voltage boosting process is implemented after the stand-by mode of operation is replaced by the normal mode of operation. The voltage boosting process is inhibited during the stand-by mode of operation. This is advantageous in reducing consumed electric power.

When the voltage boosting circuit 42 applies a boosted voltage at the output line PDL, the transistors 38 and 39 are cut off. The voltage-drop compensation circuit 41 uses the start of the feed of the sub electric power VBL by the power supply circuit 14 as a trigger. The voltage-drop compensation circuit 41 responds to the trigger, generating compensated electric power VBL' and feeding the compensated electric power VBL' to the drive control circuit 13 (see FIG. 2). The power supply circuit 14 and the voltage-drop compensation circuit 41 compose a power generation circuit 100.

In the case where the normal mode of operation is replaced by the stand-by mode of operation, the transistors 35 and 37 and also the transistors 55 and 56 are changed to their off states by the mode change signal so that the transistors 38 and 39 and also the transistors 58. 60a, and 60b fall into their off states. Thus, the generation of the compensated electric power VBL' is inhibited, and the feed of the compensated electric power VBL' to the drive control circuit 13 (see FIG. 2) is cut off. At that same time, the mode change signal inhibits the clock signal generation circuit from outputting the clock signal to the bases of the transistors 43a and 43b. The voltage at the power feed line PL drops, and hence the transistor 53 falls into its off state. When the transistor 53 falls into its off state, the transistor 52 changes to its on state so that the capacitor 50 is discharged via the transistor 52.

As previously mentioned, the power supply circuit 14 is provided with the voltage-drop compensation circuit 41. The power supply circuit 14 and the voltage-drop compensation circuit 41 compose the power generation circuit 100. The power supply circuit 14 outputs the VBL voltage to the voltage boosting circuit 42. The voltage boosting circuit 42 generates the boosted voltage from the VBL voltage. The transistor 58 is operated by the boosted voltage. It is possible to compensate for a voltage drop caused in the power supply circuit 14. The compensated electric power VBL' is generated on the basis of the sub electric power VBL fed from the power supply circuit 14. The compensated electric power VBL' is fed to the drive control circuit 13 (see FIG. 2). It is possible to improve the efficiency of use of the vehicular battery (Batt).

It should be noted that the transistors 58, 60a, and 60b may be replaced by n-channel power MOSFET's.

Fourth Embodiment

Figure 12:
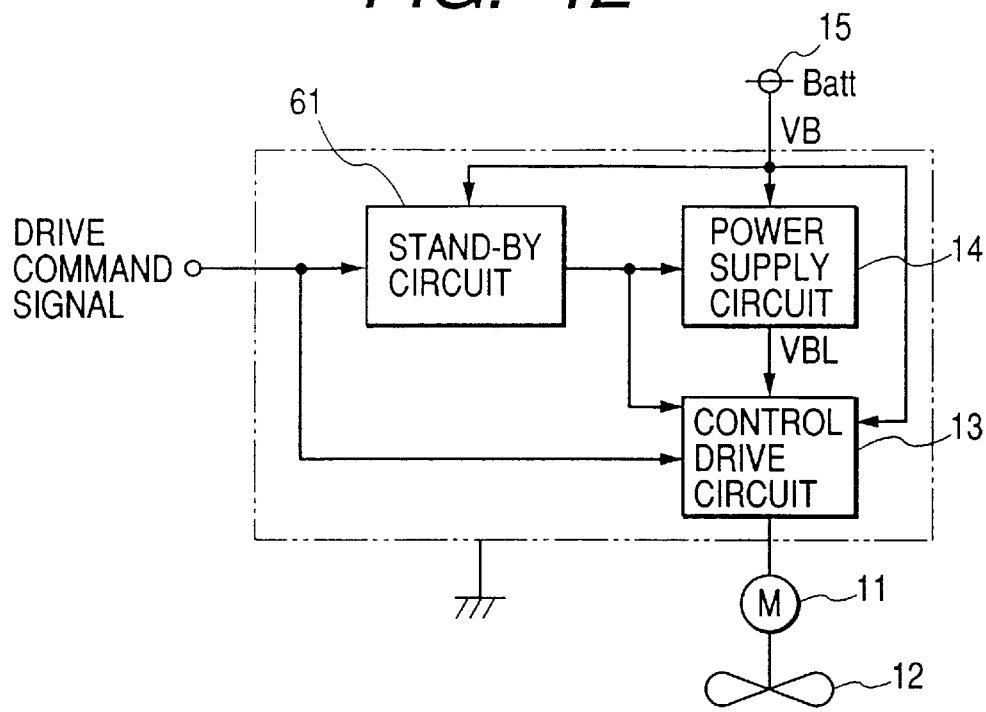
FIG. 12 is a block diagram of a load drive control apparatus according to a fourth embodiment of this invention.

FIG. 12 shows a fourth embodiment of this invention which is similar to one of the first, second, and third embodiments thereof except for design changes mentioned hereinafter. The fourth embodiment of this invention includes a stand-by circuit (a mode change means) 61 which replaces the stand-by circuit 16 in FIG. 2.

In the fourth embodiment of this invention, a drive command signal has a frequency which varies as a function of a desired rotational speed of a motor 11. For example, the frequency of the drive command signal rises as the desired rotational speed of the motor 11 increases. The stand-by circuit 61 includes a pulse-number counter which counts pulses in the drive command signal during every predetermined period of time. The stand-by circuit 61 generates a mode change signal in response to the counted pulse number.

In the case where the desired rotational speed of the motor 11 drops and the counted pulse number given in the stand-by circuit 61 decreases below a predetermined threshold number, the stand-by circuit 61 changes the mode change signal from a normal mode state to a stand-by-mode state.

Fifth Embodiment

Figure 13:
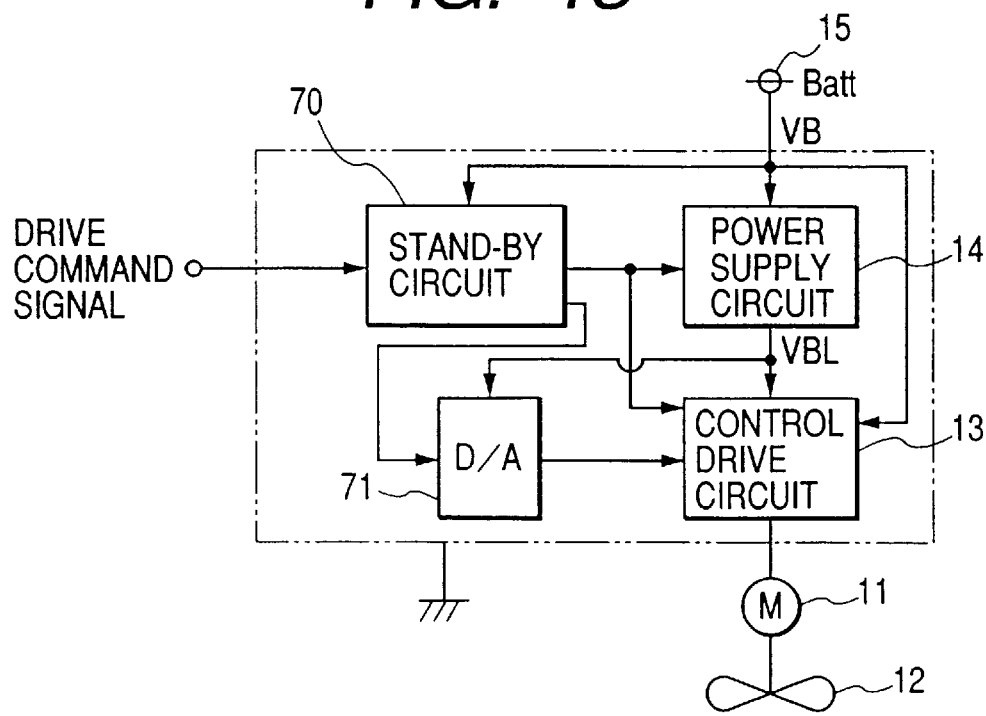
FIG. 13 is a block diagram of a load drive control apparatus according to a fifth embodiment of this invention.

FIG. 13 shows a fifth embodiment of this invention which is similar to one of the first, second, third, and fourth embodiments thereof except for design changes mentioned hereinafter. The fifth embodiment of this invention includes a stand-by circuit (a mode change means) 70 which replaces the stand-by circuit 16 in FIG. 2 or the stand-by circuit 61 in FIG. 12. The fifth embodiment of this invention also includes a D/A converter 71 which is activated by sub electric power VBL fed from a power supply circuit 14.

In the fifth embodiment of this invention, a drive command signal has a serial signal during every predetermined period of time. The serial signal has a pattern composed of low-level states and high-level states. The pattern of the serial signal designates a desired rotational speed of a motor 11. The stand-by circuit 70 converts every serial signal in the drive command signal into a corresponding parallel signal (for example, a 4-bit parallel signal). The stand-by circuit 70 generates a mode change signal in response to the parallel signal. The stand-by circuit 70 changes the mode change signal to a state corresponding to a normal mode of operation when the value represented by the parallel signal increases to a predetermined threshold value. The stand-by circuit 70 changes the mode change signal to a state corresponding to a stand-by mode of operation when the value represented by the parallel signal decreases below the predetermined threshold value or another predetermined threshold value.

The D/A converter 71 receives the parallel signal from the stand-by circuit 70. The D/A converter 71 changes the parallel signal into a corresponding analog signal representing the desired rotational speed of the motor 11. The D/A converter 71 outputs the analog signal to a drive control circuit 13.

Sixth Embodiment

Figure 14:
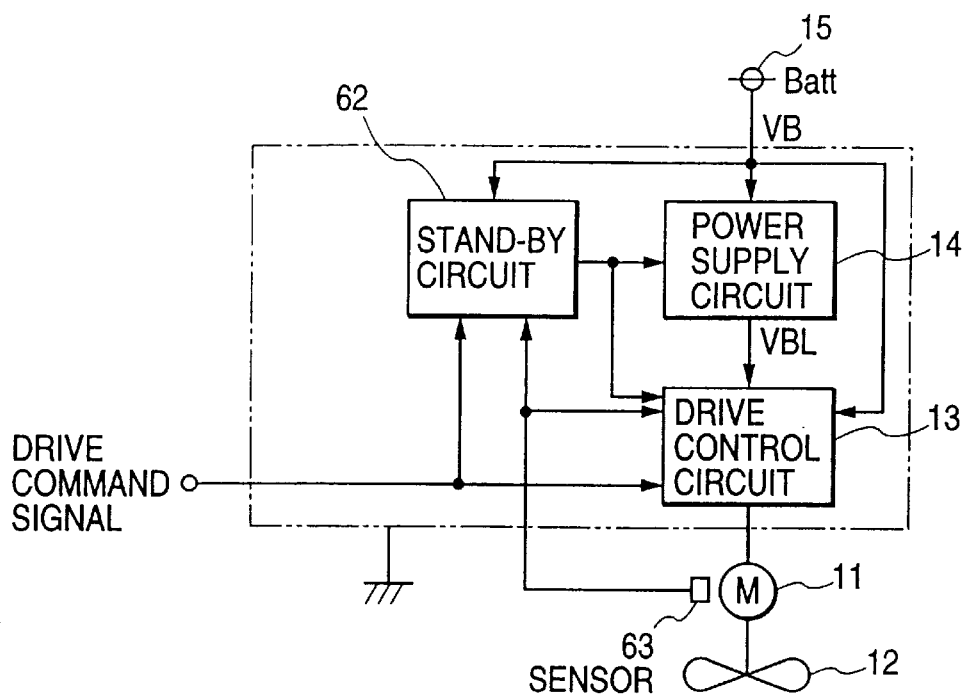
FIG. 14 is a block diagram of a load drive control apparatus according to a, sixth embodiment of this invention.

FIG. 14 shows a sixth embodiment of this invention which is similar to one of the first, second, third, and fourth embodiments thereof except for design changes mentioned hereinafter. The sixth embodiment of this invention includes a stand-by circuit (a mode change means) 62 which replaces the stand-by circuit 16 in FIG. 2 or the stand-by circuit 61 in FIG. 12. The sixth embodiment of this invention also includes a sensor 63 for detecting the rotational speed of a motor 11. The sensor 63 includes, for example, a Hall IC for sensing rotation of a rotor in the motor 11. The sensor 63 forms a load drive condition detecting means. An output signal of the sensor 63 is fed to the stand-by circuit 62 and a drive control circuit 13. The output signal of the sensor 63 has a train of pulses, the frequency of which rises as the rotational speed of the motor 11 increases.

The stand-by circuit 62 includes a pulse-number counter which counts pulses in the output signal of the sensor 63 during every predetermined period of time. The stand-by circuit 62 derives the rotational speed of the motor 11 from the counted pulse number. The stand-by circuit 62 generates a mode change signal in response to the counted pulse number.

In the case where the rotational speed of the motor 11 drops and the counted pulse number given in the stand-by circuit 62 decreases below a predetermined threshold number, the stand-by circuit 62 changes the mode change signal from a state corresponding to a normal mode of operation to a state corresponding to a stand-by mode of operation.

Seventh Embodiment

A seventh embodiment of this invention is similar to one of the first to sixth embodiments thereof except for design changes mentioned hereinafter. The seventh embodiment of this invention includes a gate drive circuit 64 of FIG. 1in place of the gate drive circuit 40 of FIG. 9.

Figure 15:
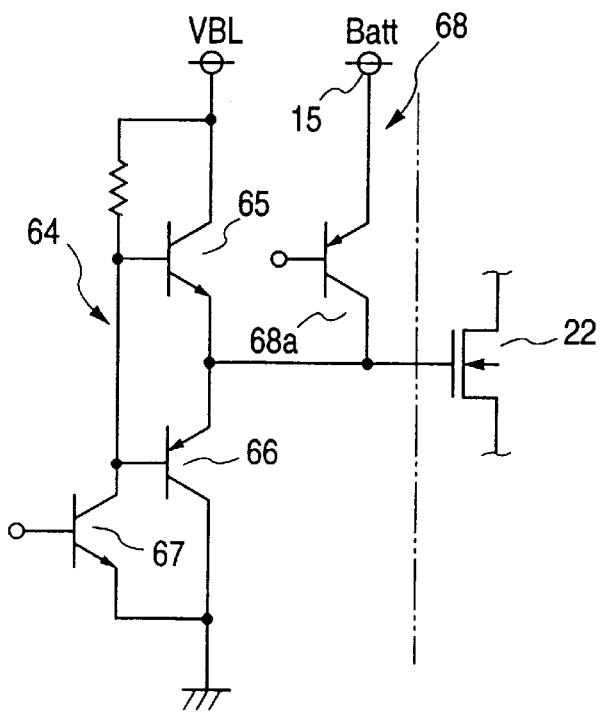
FIG. 15 is a schematic diagram of a gate drive circuit, a portion of a braking circuit, and an FET in a seventh embodiment of this invention.

As shown in FIG. 15, the gate drive circuit 64 includes an npn transistor 65, a pnp transistor 66, and an npn transistor 67. The collector of the transistor 6is connected to a positive power feed line fed with sub electric power VBL from a power supply circuit 14 (see FIG. 2). The collector of the transistor 6is connected via a resistor (no reference character) to the base thereof. The base of the transistor 6is connected to the base of the transistor 66 and the collector of the transistor 67. The emitter of the transistor 65 is connected to the emitter of the transistor 66. The collector of the transistor 66 is grounded. The emitter of the transistor 67 is grounded. The junction between the emitters of the transistors 65 and 66 is connected to the gate of an FET 22.

As shown in FIG. 15, a braking circuit 68 includes a pnp transistor 68a. The collector of the transistor 68a is connected to the gate of the FET 22. The emitter of the transistor 68a is connected to the positive terminal of a vehicular battery (Batt) 15.

The emitter of the transistor 68a receives main electric power VB from the battery 15.

During a normal mode of operation, when a high-level signal is applied to the base of the transistor 67, the transistor 67 is turned on and the transistor 6is turned off. In this case, a low-level signal is fed from the gate drive circuit 64 to the gate of the FET 22 so that the FET 22 falls into its off state. When a low-level signal is applied to the base of the transistor 67, the transistor 67 is turned off and the transistor 6is turned on. At the same time, the transistor 66 is turned off. In this case, a high-level signal is fed from the gate drive circuit 64 to the gate of the FET 22 so that the FET 22 changes to its on state.

During a stand-by mode of operation, the feed of the sub electric power VBL to the gate drive circuit 64 is cut off. In the braking circuit 68, a controller (not shown) applies a low-level signal to the base of the transistor 68a so that the transistor 68a is turned on. In this case, a high-level signal is applied to the gate of the FET 22 via the transistor 68a, and hence the FET 22 changes to its on state. Preferably, during the stand-by mode of operation, the braking circuit 68 continuously outputs the high-level signal to the gate of the FET 22. Alternatively, the braking circuit 68 may intermittently output the high-level signal to the gate of the FET 22 at a predetermined period.

Other Embodiments

Each of the first to seventh embodiments of this invention may be modified as follows.

According to a first modification, the predetermined threshold value or the predetermined criterion of the low-level duty cycle of the drive command signal for the operation mode change is equal to 3%, 10%, or a value greater than 20%.

According to a second modification, the drive command signal has a level (a voltage) which varies as a function of a desired rotational speed of the motor. When the level of the drive command signal exceeds a reference voltage Vref, the first comparator 27 controls the change control circuit 31 so that the capacitor 32 starts to be continuously charged (see FIG. 4). Therefore, the voltage at the first end of the capacitor 32 rises. The second comparator 33 changes the mode change signal from the stand-by-mode state to the normal-mode state in response to the rise in the voltage at the first end of the capacitor 32. On the other hand, when the level of the drive command signal drops below the reference voltage Vref or another threshold voltage, the first comparator 27 controls the change control circuit 31 so that the capacitor 32 starts to be continuously discharged (see FIG. 4). Therefore, the voltage at the first end of the capacitor 32 drops. The second comparator 33 changes the mode change signal from the normal-mode state to the stand-by-mode state in response to the drop in the voltage at the first end of the capacitor 32.

According to a third modification, the stand-by circuit 16 (see FIG. 4) adjusts the reference voltage Vref in response to the voltage VB of the battery 15. Specifically, when the voltage VB of the battery 15 drops below a predetermined level, the reference voltage Vref is adjusted to retard a timing of the change of the mode change signal from the stand-by-mode state to the normal-mode state, and to advance a timing of the change of the mode change signal from the normal-mode state to the stand-by-mode state. This is advantageous in reducing consumed electric power.

A fourth modification uses bipolar transistors or IGBT's (insulated gate bipolar transistors) in place of the FET's 19–24 (see FIG. 3).

A fifth modification includes a first sensor for detecting a current flowing through the motor 11. The first sensor forms a load drive condition detecting means. A decision is made about whether or not the motor 11 is locked up by referring to an output signal of the first sensor. In addition, a decision is made about whether or not an over-current flows through the motor 11 by referring to the output signal of the fist sensor. The fifth modification also includes a second sensor for detecting a temperature of the FET's 19–24 (see FIG. 3). A decision is made about whether or not the FET's 19–24 are excessively heated by referring to an output signal of the second sensor. The mode change circuit 16, 61, 62, or 70 changes the mode change signal to the stand-by-mode state when it is decided that the motor 11 is locked up, or when an over-current flows through the motor 11. Also, the mode change circuit 16, 61, 62, or 70 changes the mode change signal to the stand-by-mode state when it is decided that the FET's 19–24 are excessively heated.

Accordingly, it is possible to protect the motor 11 and the FET's 19–24.

A sixth modification uses a voltage boosting chopper circuit which includes an inductor and a transformer. The voltage boosting chopper circuit replaces the voltage boosting circuit 42 in FIG. 10.

According to a seventh modification, the braking circuit 25 turns on only one or two of the FET's 19–21 during the stand-by mode of operation (see FIG. 3).

According to an eighth modification, the braking circuit 25 controls the FET's 22–24 during the stand-by mode of operation (see FIG. 3). Specifically, the braking circuit turns on at least one of the FET's 22–24 during the stand-by mode of operation.

The braking circuit (see FIG. 3) and the braking circuit 68 (see FIG. 15) are omitted from a ninth modification.

According to a tenth modification, the sub electric power VBL is fed to the drive circuit 18 (see FIG. 3) from the power supply circuit 14 (see FIG. 2).

According to an eleventh modification, the motor 11 has three-phase stator windings connected in a "Y" configuration.

According to a twelfth modification, the motor 11 is replaced by another load.

What is claimed is:

1. A load drive control apparatus comprising:

a drive control circuit for driving and controlling a load in response to a drive command signal;

a power supply circuit for feeding drive electric power to the drive control circuit; and mode change means for controlling feed of the drive electric power to the drive control circuit by the power supply circuit in response to the drive command signal for drive and control of the load to implement a change between a normal mode of operation and a stand-by mode of operation in which consumed electric power is reduced;

wherein said mode change means comprises a capacitor, a charging/discharging change circuit for selectively charging and discharging the capacitor in response to the drive command signal, and means for implementing a change between the normal mode and the stand-by mode in response to a voltage at an end of the capacitor.

2. A load drive control apparatus comprising:

a drive control circuit for driving and controlling a load in response to a drive command signal;

a power supply circuit for feeding drive electric power to the drive control circuit; and mode change means for controlling feed of the drive electric power to the drive control circuit by the power supply circuit in response to the drive command signal for drive and control of the load to implement a change between a normal mode of operation and a stand-by mode of operation in which consumed electric power is reduced;

wherein the drive command signal includes a pulse signal having a frequency which depends on the drive condition, and the mode change means comprises means for detecting the frequency of the pulse signal, and means for implementing a change between the normal mode and the stand-by mode in response to the detected frequency of the pulse signal.

3. A load drive control apparatus comprising:

a drive control circuit for driving and controlling a load in response to a drive command signal;

a power supply circuit for feeding drive electric power to the drive control circuit;

mode change means for controlling feed of the drive electric power to the drive control circuit by the power supply circuit in response to the drive command signal for drive and control of the load to implement a change between a normal mode of operation and a stand-by mode of operation in which consumed electric power is reduced; and a main power source;

wherein the power supply circuit derives the drive electric power from main electric power fed from the main power source, and wherein the mode change means comprises means for detecting a voltage of the main power source, and means for change a timing of a change between the normal mode and the stand-by mode in response to the detected voltage of the main power supply.

4. A load drive control apparatus comprising:

a drive control circuit for driving and controlling a load in response to a drive command signal;

a power supply circuit for feeding drive electric power to the drive control circuit; and mode change means for controlling feed of the drive electric power to the drive control circuit by the power supply circuit in response to the drive command signal for drive and control of the load to implement a change between a normal mode of operation and a stand-by mode of operation in which consumed electric power is reduced;

wherein the power supply circuit comprises switching elements for controlling feed of the drive electric power to the drive control circuit, a voltage boosting circuit for boosting a voltage of the drive electric power, and a voltage-drop compensation circuit for compensating for a voltage drop caused by the switching elements on the basis of the boosted voltage generated by the voltage boosting circuit.

5. A load drive control apparatus comprising:

a drive control circuit for driving and controlling a load in response to a drive command signal;

a power supply circuit for feeding drive electric power to the drive control circuit; a mode change means for controlling feed of the drive electric power to the drive control circuit by the power supply circuit in response to the drive command signal for drive and control of the load to implement a change between a normal mode of operation and a stand-by mode of operation in which consumed electric power is reduced; and a voltage boosting circuit for boosting a voltage of the drive electric power fed from the power supply circuit, and a power generation circuit for generating boosted electric power on the basis of the boosted voltage generated by the voltage boosting circuit, and for feeding the boosted electric power to the drive control circuit.

6. A load drive control apparatus comprising:

a drive control circuit for driving and controlling a load in response to a drive command signal;

a power supply circuit for feeding drive electric power to the drive control circuit; and mode change means for controlling feed of the drive electric power to the drive control circuit by the power supply circuit in response to the drive command signal for drive and control of the load to implement a change between a normal mode of operation and a stand-by mode of operation in which consumed electric power is reduced;

wherein the drive control circuit comprises switching elements for controlling the load, and means for tuning on at least one of the switching elements to brake the load when the normal mode has been replaced by the stand-by mode.

7. A load drive control apparatus comprising:

a drive control circuit for driving and controlling a load in response to a drive command signal;

a power supply circuit for feeding drive electric power to the drive control circuit; and mode change means for controlling feed of the drive electric power to the drive control circuit by the power supply circuit in response to the drive command signal for drive and control of the load to implement a change between a normal mode of operation and a stand-by mode of operation in which consumed electric power is reduced;

wherein the drive command signal includes a serial signal having a pattern composed of high-level states and low-level states, the pattern depending on the drive condition, and wherein the mode change means comprises means for detecting the pattern of the serial signal, and means for implementing a change between the normal mode and the stand-by mode in response to the detected pattern of the serial signal.

8. A load drive control apparatus comprising;

a drive control circuit for driving and controlling a load in response to a given drive condition;

a power supply circuit for feeding drive electric power to the drive control circuit;

mode change means for controlling feed of the drive electric power to the drive control circuit by the power supply circuit in response to a control signal for drive and control of the load to implement a change between a normal mode of operation and a standby mode of operation in which consumed electric power is reduced; and means for detecting a drive condition of the load, and means for generating the control signal in response to the detected drive condition, and wherein the mode change means comprises means for detecting whether or not drive of the load is suspended on the basis of the control signal, and means for implementing a change from the normal mode to the stand-by mode when it is detected that the drive of the load is suspended.

9. A load drive control apparatus as recited in claim 8, wherein the mode change means comprises means for detecting whether or not the drive of the load is abnormal, and means for implementing a change from the normal mode to the stand-by mode when it is detected that the drive of the load is abnormal.

10. A load drive control apparatus comprising:

a drive control circuit for driving and controlling a load in response to a given drive condition;

a power supply circuit for feeding drive electric power to the drive control circuit, mode change means for controlling feed of the drive electric power to the drive control circuit by the power supply circuit in response to a control signal for drive and control of the load to implement a change between a normal mode of operation and a standby mode of operation in which consumed electric power is reduced; and means for detecting a condition of control by the drive control circuit, and means for generating the control signal in response to the detected control condition, and wherein the mode change means comprises means for detecting whether or not the control by the drive control circuit is abnormal, and means for implementing a change from the normal mode to the stand-by mode when it is detected that the control by the drive control circuit is abnormal.

11. A load drive control apparatus as recited in claim 1, wherein the drive command signal includes a pulse signal having a duty cycle which depends on the drive condition, and the mode change means comprises a charging circuit for charging the capacitor by a charging current, and a discharging circuit for discharging the capacitor at a discharging current, and wherein a ratio between the charging current and the discharging current is substantially equal to a duty cycle of the pulse signal which corresponds to a threshold value for a change between the normal mode and the stand-by mode.

12. A load drive control apparatus as recited in claim 11, wherein the duty cycle corresponding to the threshold value is smaller than a duty cycle of the pulse signal which corresponds to a condition of starting drive of the load.

13. A load drive control apparatus as recited in claim 5, wherein the power generation circuit comprises means for starting operation of the voltage boosting circuit when the mode change means implements a change from the stand-by mode to the normal mode.

* * * * *